United States Patent [19]

Stein

[11] Patent Number: 5,167,556

[45] Date of Patent: Dec. 1, 1992

[54] METHOD FOR MANUFACTURING A LIGHT EMITTING DIODE DISPLAY MEANS

[75] Inventor: Karl-Ulrich Stein, Unterhaching, Fed. Rep. of Germany

[73] Assignee: Siemens Aktiengesellschaft, Munich, Fed. Rep. of Germany

[21] Appl. No.: 710,467

[22] Filed: Jun. 5, 1991

[30] Foreign Application Priority Data

Jul. 3, 1990 [DE] Fed. Rep. of Germany ....... 4021128

[51] Int. Cl.$^5$ .............................................. H05B 33/20
[52] U.S. Cl. ........................................ 445/24; 29/841;
313/500; 313/510; 313/512; 364/255;
364/272.17; 340/762
[58] Field of Search .................... 29/841, 856; 445/24;
313/500, 510, 512; 264/1.7, 272.16, 272.17, 255;
340/762, 786

[56] References Cited

U.S. PATENT DOCUMENTS

| | | | |
|---|---|---|---|
| 3,849,383 | 11/1974 | Fetscher et al. | 313/500 X |
| 3,938,177 | 2/1976 | Hansen et al. | 357/17 X |
| 3,999,280 | 12/1976 | Hansen et al. | 29/569 L |
| 4,000,437 | 12/1976 | Lederhandler et al. | |
| 4,058,750 | 11/1977 | Schoberl. | |
| 4,267,486 | 5/1981 | Thillays | 312/512 X |
| 4,486,364 | 12/1984 | Takahashi | 264/1.7 |
| 4,843,280 | 5/1989 | Lumbard et al. | 313/500 |
| 4,859,632 | 8/1989 | Lumbard | 29/841 X |
| 4,890,383 | 1/1990 | Lumbard et al. | 445/24 X |
| 5,059,373 | 10/1991 | Hirabayashi | 264/255 X |

FOREIGN PATENT DOCUMENTS

| | | |
|---|---|---|
| 3320953 A1 | 12/1984 | Fed. Rep. of Germany. |
| 3833315 A1 | 4/1990 | Fed. Rep. of Germany. |
| 2198675 | 3/1974 | France. |
| 58-194381 | 11/1983 | Japan. |
| 2206444-A | 1/1989 | United Kingdom. |

OTHER PUBLICATIONS

"Neuer Vierfach-Leistungstreiber FZL 4141B mit Kurzschlussmeldeausgang", Siemens Components 23 (1985), Heft 2, pp. 90-91.
"Das LED-Display ein vielseitiges Anzeigeelement", Elektronik Industrie, 1981, pp. 18-22.
"Optoelektronische Anzeigeeinheiten", Elektronik 1976 Heft 4, pp. 36-42.

Primary Examiner—Kenneth J. Ramsey
Attorney, Agent, or Firm—Hill, Van Santen, Steadman & Simpson

[57] ABSTRACT

A method for manufacturing an LED display means, whereby a plurality of LED chips are arranged on a system carrier composed of interconnects and the LED chips are individually respectively embedded in a light-guiding channel composed of a transparent plastic allocated thereto and having a light exit window. The method enables the realization of surface-mountable LED displays that can be flow-soldered. The specifically designed system carrier is equipped with sealing and supporting webs and those locations provided with the LED chips are enveloped with a diffusely scattering, transparent plastic for the formation of mutually separated light-guiding channels. After solidification of the plastic, the sealing and supporting webs in the inside of the system carrier are removed in a first punch-free process and the light-guiding channels and the inside regions of the system carriers surrounding light-guiding channels are then provided with a reflective envelope. The method is employed in the manufacture of LED displays and LED symbol lamps.

15 Claims, 2 Drawing Sheets

METHOD FOR MANUFACTURING A LIGHT EMITTING DIODE DISPLAY MEANS

BACKGROUND OF THE INVENTION

The present invention is directed to a method for manufacturing a light-emitting diode display means, whereby a plurality of light-emitting diode chips is arranged and contacted on a system carrier composed of interconnects, and whereby the light-emitting diode chips are individually embedded respectively in a light-guiding channel composed of a diffusely scattering plastic and having a light exit window.

Such display arrangements are known in the prior art. What is referred to as a leadframe is employed as a system carrier for the light-emitting diode (LED) chips. A standard structure having what are referred to as dual in-line (DIL) terminals has been established in recent years for these display arrangements, however this standard does not satisfy the current demands for surface-mountable components. In particular, the known displays are not adequately temperature-resistant in order to withstand flow soldering required in SMD (surface mounted device) technology. Moreover, the electrical terminals are not readily SMD-compatible.

Initial solutions to this problem have only been in the replacement of the individual segments of the display by, for example, individual SOT-23-LEDs. Such solutions, however, are complex and uneconomical.

SUMMARY OF THE INVENTION

An object of the present invention is to provide a method for manufacturing a light-emitting diode display means that, in particular, enables the realization of surface-mountable LED displays that can be flow soldered.

Another object of this invention is to provide a flat LED (light emitting diode) system carrier, or lead frame with mutually separated light-guiding channels which encapsulate each light-emitting diode and the associated connection members of the system carrier (lead frame) and which are provided with a light reflective envelope. This object is inventively achieved by equipping the flat system carrier with through passages to enable the molding of each light guiding channel and with temporary sealing and supporting webs that are removed, preferably by a punch-clear process, after the solidification of the light-guiding channels to enable the provision of a reflective envelope by a subsequent molding or coating process. Lastly, the devices including the associated leads are punched clear of the carrier strip, and bending and measuring processes are implemented. The term "punch-clear" refers to freeing a respective part with a punch out process.

The system carrier (leadframe) preferably has the locations provided with the light-emitting diode (LED) chips extrusion-coated with an injection molding compound containing a diffuser material for the formation of mutually separated light-guiding channels.

In an advantageous development of the present invention, the light-guiding channels (after the solidification of the plastic) and the regions of the system carrier adjacent thereto are extrusion-coated with a highly reflective, white compound as a reflective envelope.

In a development of the present invention, the reflective envelope is applied onto the surfaces of the light-guiding channels after the solidification thereof and is applied onto parts of the system carrier adjacent thereto, being applied by immersion or spraying.

A particular advantage of an arrangement manufactured in conformity with the method of the present invention is that the displays are SMD-compatible and can be manipulated in strip technique or in what is referred to as reel-to-reel technique from a first die bond step to a final measurement step. This provides an extremely cost-beneficial mechanization and represents the prerequisite for a DPM quality in the manufacture. The problems existing in current manufacturing techniques such as stressing the bond wires and crosstalk between the segments are avoided by the design.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
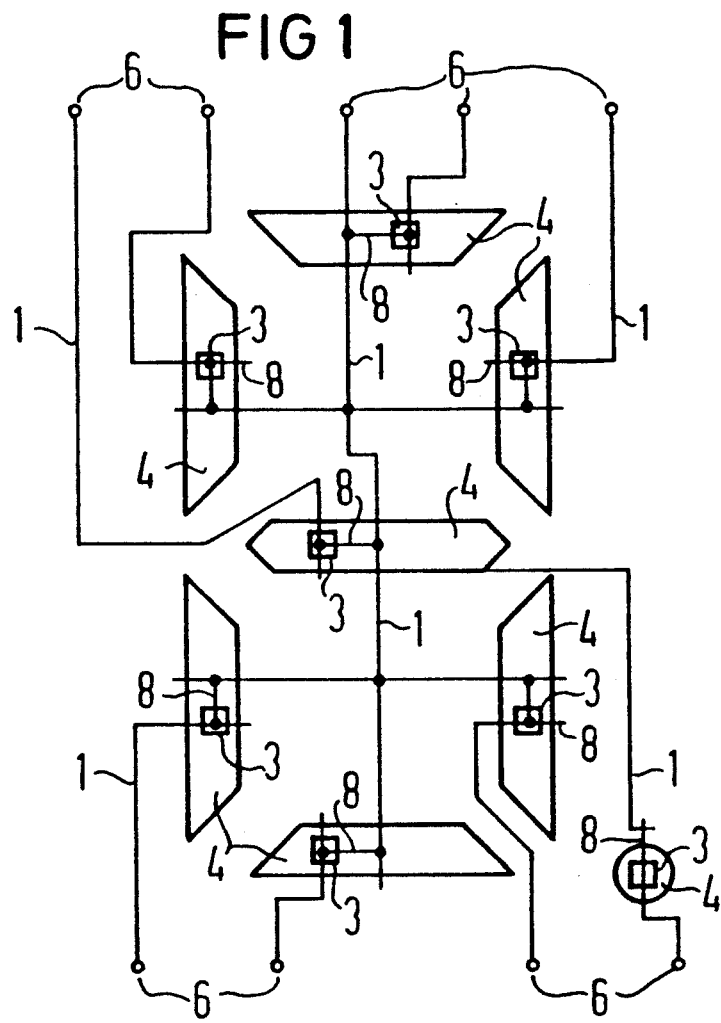
FIG. 1 is a contacting diagram of the display of the present invention.
Figure 2:
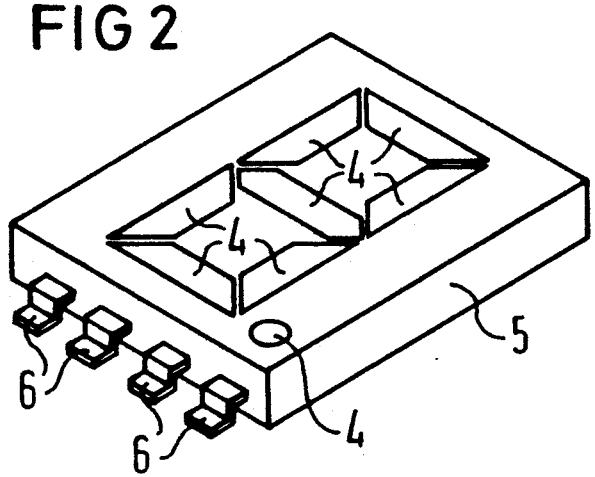
FIG. 2 is a perspective view of the display with SMD terminals.

An SMD display that can be flow soldered is inventively manufactured in the following method steps. A specifically designed, flat leadframe that is equipped with sealing and supporting webs to an adequate degree serves as system carrier 1 for the overall display. That is, the leadframe is configured according to the particular SMD display for which it is used. The individual LED chips 3 are applied on this system carrier (leadframe) 1 in a standard die wire bond method. In the following step, the system carrier (leadframe) 1 provided with the LED chips 3 is extrusion-coated with the optically transparent light-guiding channels 4 for the individual segments. An example of the contacting diagram is shown in FIG. 1. These light-guiding channels 4 have no connection to one another. For mechanical reinforcement, they only expediently have additional support elements vis-a-vis the system carrier (leadframe) 1. The light-guiding channels 4 are composed of a transparent injection molding compound that is laced with a diffuser material. The light-guiding channels 4 preferably are injection molded to completely envelope the LED units system carrier 1 at respective LED chip locations and are produced in a known manner. In a subsequent step, the supporting and sealing webs in the inside of the display are removed in a first punch-clear process. In a further method step, the light-guiding channels 4 and parts of the system carrier (leadframe) 1 are extrusion-coated with a highly reflective, white compound (envelope 5). Only the electrical terminals 6 together with the sealing webs and the light exit windows of the segments or, respectively, light-guiding channels 4 remain open. Following as final steps are punch-clear, bending and measuring processes as well as, when necessary, a working (for example, milling) of the surface, so that the display having SMD-compatible terminals 6 shown as an example in FIG. 2 results.

As an alternative to the second extrusion-coating (double mold) with a white reflector material, the system carrier (leadframe) 1 and first extrusion-coating with transparent material, i.e. the light-guiding channels 4 produced in this manner are executed so stably that only a reflective surface is applied to the appertaining areas, for example by immersion or spraying.

Figure 3:
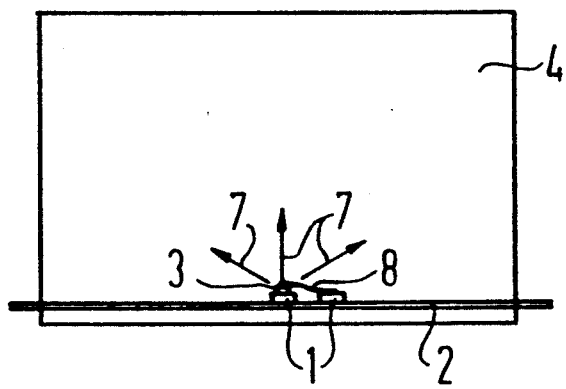
FIG. 3 is a section view of a forward-emission display segment in a section.
Figure 4:
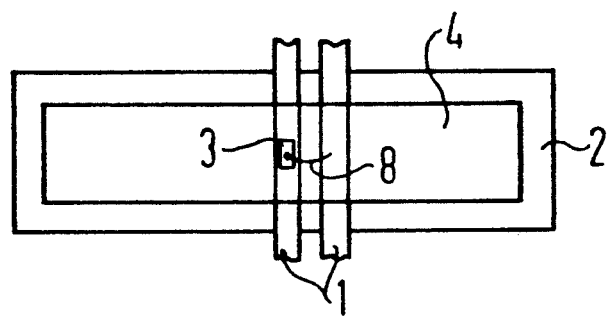
FIG. 4 is a plan view of the segment of FIG. 3.

The light-guiding channels 4 serving as luminesce segments can be equipped with forward-emitting LED chips 3, i.e. LED chips 3 that emit toward the surface (light exit window). Such a display segment is shown in a side view in FIG. 3 and in a plan view in FIG. 4. The direction of light propagation of light from the LED chip 3 is indicated with arrows 7. A sealing or, respectively, supporting web 2 shown in this example extends transversely by means of two interconnects of the system carrier 1. The LED chip 3 is arranged and contacted on one interconnect. The other interconnect forms the second electrical terminal for the light-emitting diode 3 via a connecting wire (die bond) 8. An overall height similar to current displays for comparable diffuser content can be achieved with this arrangement.

Figure 5:
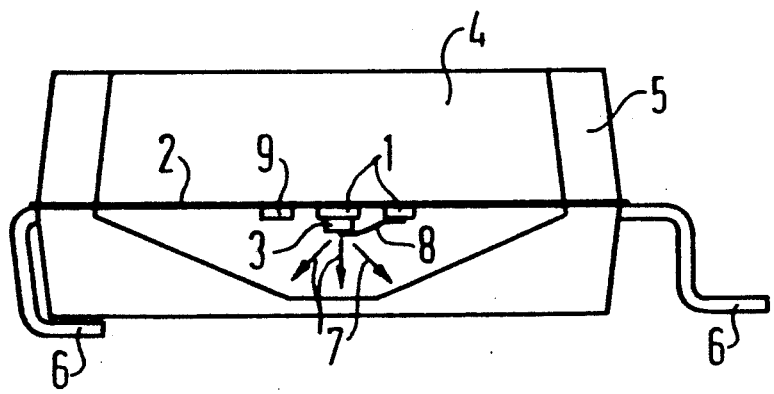
FIG. 5 is a section view of a backward-emission display segment.

It is provided as a further version that the LED chips 3 emit toward the back that is in a rearward direction. Comparable to the SOJ housing standard for integrated circuits, a lower overall height given lower diffuser content can thus be achieved. Such a display segment is shown in FIG. 5. The left-hand electrical terminal (contact) 6 shown in FIG. 5 thereby has the shape of a J-leg. The parts of the leadframe (system carrier 1) that penetrate through the light-guiding segment (light-guiding channel 4) at both sides as chip carrier or, respectively, as contacting web are designed as narrow as possible in order to achieve a uniform segment illumination, particularly for backward-emitters, and may potentially be designed as a triple symmetrical arrangement with a non-utilized web 9. The non-utilized web 9 can also contribute to the mechanical reinforcement of the light-guiding channel 4 as an additional supporting element. In particular, when the principle of the backward radiator is suitably modified, then an individual luminous segment or a luminous surface can be designed for surface mounting.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for manufacturing a light-emitting diode display means, having a plurality of light-emitting diode chips arranged and contacted on a system carrier composed of interconnects, the light-emitting diode chips respectively individually embedded in a light-guiding channel composed of an optically transparent plastic allocated thereto and having a light exit window, comprising the steps of:
   providing a flat system carrier with sealing and supporting webs;
   enveloping locations provided with the light-emitting diode chips on the system carrier with a diffusely scattering, transparent plastic for the formation of mutually separated light-guiding channels;
   solidifying the plastic;
   removing the supporting and sealing webs in an inside of the system carrier in a first punch clear process; and
   providing the light-guiding channels and inside regions of the system carrier surrounding said light-guiding channels with a reflective envelope.

2. The method according to claim 1, wherein the system carrier has the locations provided with the light-emitting diode chips extrusion-coated with a transparent injection molding compound containing a diffuser material for the formation of mutually separated light-guiding channels.

3. The method according to claim 1, wherein after the solidification of the plastic, the light-guiding channels and those regions of the system carrier adjacent thereto are extrusion-coated with a highly reflective, white compound as a reflective envelope.

4. The method according to claim 1, wherein after the solidification of the plastic, the reflective envelope is applied by immersion or spraying onto surfaces of said light-guiding channels and onto parts of the system carrier adjacent thereto.

5. The method according to claim 1, wherein the light-guiding channels are provided with additional supporting elements of the system carrier for mechanical reinforcement.

6. A method for manufacturing a light-emitting diode display means, having a plurality of light-emitting diode chips arranged and contacted on a system carrier composed of interconnects, the light-emitting diode chips respectively individually embedded in a light-guiding channel composed of an optically transparent plastic allocated thereto and having a light exit window, comprising the steps of:
   providing a flat system carrier with webs;
   extrusion-coating locations provided with the light-emitting diode chips on the system carrier with a transparent injection molding compound containing a diffuser material for the formation of mutually separated light-guiding channels;
   solidifying the plastic;
   removing webs in an inside of the system carrier; and
   providing the light-guiding channels and inside regions of the system carrier surrounding said light-guiding channels with a reflective envelope.

7. The method according to claim 6, wherein after the solidification of the plastic, the light-guiding channels and those regions of the system carrier adjacent thereto are extrusion-coated with a highly reflective, white compound as a reflective envelope.

8. The method according to claim 6, wherein after the solidification of the plastic, the reflective envelope is applied by immersion or spraying onto surfaces of said light-guiding channels and onto parts of the system carrier adjacent thereto.

9. A method for manufacturing a light-emitting diode display means, having a plurality of light-emitting diode chips arranged and contacted on a system carrier composed of interconnects, the light-emitting diode chips respectively individually embedded in a light-guiding channel composed of an optically transparent plastic allocated thereto and having a light exit window, comprising the steps of:
   providing a flat system carrier with webs;

extrusion-coating locations provided with the light-emitting diode chips on the system carrie with a transparent injection molding compound containing a diffuser material for the formation of mutually separated light-guiding channels;

solidifying the plastic;

removing webs in an inside of the system carrier; and providing the light-guiding channels and inside regions of the system carrier surrounding said light-guiding channels with a reflective envelope, the light-guiding channels being provided with additional supporting elements of the system carrier for mechanical reinforcement.

10. The method according to claim 9, wherein after the solidification of the plastic, the light-guiding channels and those regions of the system carrier adjacent thereto are extrusion-coated with a highly reflective, white compound as a reflective envelope.

11. The method according to claim 9, wherein after the solidification of the plastic, the reflective envelope is applied by immersion or spraying onto surfaces of said light-guiding channels and onto parts of the system carrier adjacent thereto.

12. A method for manufacturing a light-emitting diode display means, having a plurality of light-emitting diode chips arranged and contacted on a system carrier composed of interconnects, the light-emitting diode chips respectively individually embedded in a light-guiding channel composed of an optically transparent plastic allocated thereto and having a light exit window, comprising the steps of:

providing a system carrier having a plurality of light-emitting diode chips;

enveloping locations provided with the light-emitting diode chips on the system carrier with a diffusely scattering, transparent plastic for the formation of mutually separated light-guiding channels;

solidifying the plastic; and providing the light-guiding channels with a reflective envelope, wherein the light-guiding channels are provided with additional supporting elements of the system carrier for mechanical reinforcement.

13. The method according to claim 12, wherein the system carrier has the locations provided with the light-emitting diode chips extrusion-coated with a transparent injection molding compound containing a diffuser material for the formation of mutually separated light-guiding channels.

14. The method according to claim 12, wherein after the solidification of the plastic, the light-guiding channels and regions of the system carrier adjacent thereto are extrusion-coated with a highly reflective, white compound as a reflective envelope.

15. The method according to claim 12, wherein after the solidification of the plastic, the reflective envelope is applied by immersion or spraying onto surfaces of said light-guiding channels and onto parts of the system carrier adjacent thereto.

* * * * *